US012791933B2

(12) United States Patent
Jeong

(10) Patent No.: US 12,791,933 B2
(45) Date of Patent: Nov. 10, 2026

(54) CURVED MASK LAYERS BASED ON LEVELSET FUNCTIONS

(71) Applicant: Synopsys, Inc., Sunnyvale, CA (US)

(72) Inventor: Moongyu Jeong, Gwangmyeong (KR)

(73) Assignee: Synopsys, Inc., Sunnyvale, CA (US)

( * ) Notice: Subject to any disclaimer, the term of this patent is extended or adjusted under 35 U.S.C. 154(b) by 555 days.

(21) Appl. No.: 18/499,520

(22) Filed: Nov. 1, 2023

(65) Prior Publication Data

US 2025/0138412 A1 May 1, 2025

(51) Int. Cl.
*G03F 1/36* (2012.01)

(52) U.S. Cl.
CPC .................................... *G03F 1/36* (2013.01)

(58) Field of Classification Search
USPC ............................ 716/50, 51, 52, 53, 54, 55
See application file for complete search history.

(56) References Cited

U.S. PATENT DOCUMENTS

2005/0149902 A1* 7/2005 Shi ............................ G03F 1/36 716/52
2008/0127027 A1* 5/2008 Gallatin .................... G03F 1/36 430/30
2016/0103390 A1* 4/2016 Fujimura ............ H01J 37/3026 430/5

OTHER PUBLICATIONS

Wikipedia, "Signed distance function," Last edited Sep. 26, 2023, 4 pages, Retrieved from the internet <URL: https://en.wikipedia.org/wiki/Signed_distance_function>.

* cited by examiner

*Primary Examiner* — Brian Ngo
(74) *Attorney, Agent, or Firm* — Fenwick & West LLP

(57) ABSTRACT

In some aspects, a lithographic mask having multiple features including a curved main feature is designed. A mask layer that represents a vector representation of the lithographic mask is first accessed. A correction field between a simulation field and a target field is then computed. The simulation field is a field representation of a simulated result of a lithography process using the lithographic mask, and the target field is a field representation of a target result of the lithography process. The main feature of a mask field is modified based on the correction field, where the mask field is a field representation of the main feature of the lithographic mask. Finally, the main feature of the mask layer is updated based on the modification to the mask field. This process can be repeated for multiple iterations, and, after the last iteration, a final version of the mask layer is output.

20 Claims, 15 Drawing Sheets

| Clip of Fig. 10A | TAT(s) | Max EPE | Min EPE | Mean abs EPE |
|---|---|---|---|---|
| Levelset Solver | 62.4 | 0.58 | -0.62 | 0.22 |
| First ILT Algorithm | 96.7 | 1.38 | -1.30 | 0.44 |
| Second ILT Algorithm | 176.4 | 0.53 | -0.75 | 0.27 |
| Third ILT Algorithm | 1222.0 | 1.03 | -0.94 | 0.41 |
| OPC Algorithm | 324.6 | 0.40 | -1.02 | 0.36 |

FIG. 12A

| Clip of Fig. 10B | TAT(s) | Max EPE | Min EPE | Mean abs EPE |
|---|---|---|---|---|
| Levelset Solver | 62.6 | 0.30 | -0.48 | 0.12 |
| First ILT Algorithm | 104.9 | 0.67 | -0.73 | 0.30 |
| Second ILT Algorithm | 171.1 | 0.50 | -0.50 | 0.27 |
| Third ILT Algorithm | 880.2 | 0.72 | -0.83 | 0.30 |
| OPC Algorithm | 319.0 | 0.50 | -0.86 | 0.23 |

FIG. 12B

CURVED MASK LAYERS BASED ON LEVELSET FUNCTIONS

TECHNICAL FIELD

The present disclosure relates to lithography simulation, including the design of curved mask layers based on levelset functions.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate device structures on the wafer.

As designs for integrated circuits are becoming larger, denser, and more complex, the demands on computational lithography solutions for developing the masks used in fabrication are increasing. The features on masks are becoming smaller and less rectilinear. For example, advanced mask writing tools can produce curved shapes. However, lithographic shapes traditionally are represented as polygons and tools used for computational lithography are designed to work with polygons. Representing curved shapes as polygons makes their simulation and correction more difficult and more computationally intensive. On the other hand, many computational lithography tools are not well suited to directly handling curved shapes.

SUMMARY

In some aspects, a lithographic mask having multiple features including a curved main feature (e.g., curvilinear main feature) is designed based on levelset functions. A mask layer that represents a vector representation of the lithographic mask is first accessed. A correction field between a simulation field and a target field is then computed. The simulation field is a field representation (e.g., levelset) of a simulated result of a lithography process using the lithographic mask, and the target field is a field representation (e.g., levelset) of a target result of the lithography process. The main feature of a mask field is modified based on the correction field. The mask field is a field representation (e.g., levelset) of the main feature of the lithographic mask. Finally, the main feature of the mask layer is modified based on the modification to the mask field. This process can be repeated for multiple iterations, and, after the last iteration, a final version of the mask layer (i.e., final synthesized lithographic mask) is output.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 12A is a table with runtimes and different edge placement errors (EPEs) for the iterative mask layer design process presented herein benchmarked against the conventional mask layer design processes for the contact layer of FIG. 10A.

FIG. 12B is a table with runtimes and different EPEs for the iterative mask layer design process presented herein benchmarked against the conventional mask layer design processes for the contact layer of FIG. 10B.

DETAILED DESCRIPTION

Figure 1:
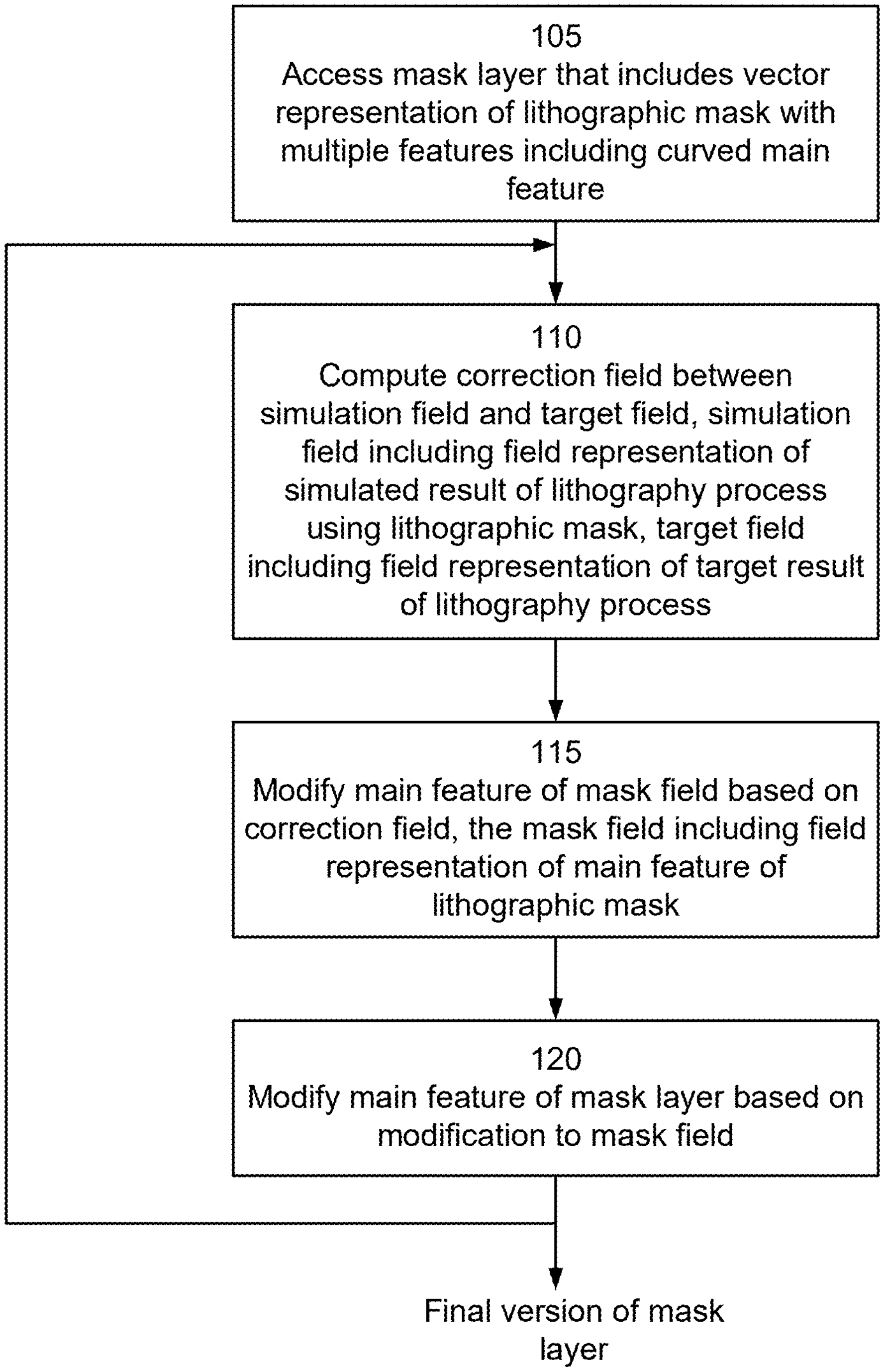
FIG. 1 illustrates a flow diagram of operations of a mask layer design process in accordance with some embodiments of the present disclosure.

Aspects of the present disclosure relate to the design of curved mask layers based on levelset functions. Lithographic masks are used in lithography processes to print features on a wafer. The lithographic mask includes many features, which may be classified as main features and assist features. The main features are the features that are primarily responsible for producing the corresponding printed features on the wafer. However, the main features alone may not be adequate to produce printed features of sufficient quality. The assist features are auxiliary features that improve the quality of the printed features.

As technology progresses, these features are becoming smaller and less rectangular. The mask features may be curved. In the design phase, the curved mask features may be used as input to a simulation of the lithography process. The simulation predicts the result of the lithography process. This is compared to a desired (target) result. The mask design is modified until the simulated result matches the target result.

In order to do this efficiently, the computational tools used to analyze and correct these features during the design phase must be able to handle curved features. Traditionally, however, mask layers and other lithographic layouts are represented by polygons and, more specifically, rectilinear polygons. The use of sub-resolution assist features and curved main shapes makes the traditional representation based on rectilinear polygons less than ideal. Approximating a curved shape by rectilinear polygons requires a large number of vertices and may still represent the curved edge by a staircase approximation. Even if non-rectilinear polygons are allowed, a curved edge will still require a polygon with a large number of sides to approximate the curve. The simulation and correction of curved mask layers using these polygon approximations can be time-consuming.

In the approach described herein, curved masks are represented by curves (rather than polygon approximations) and the design iterations for these curved masks is handled by using levelset functions. A curved mask feature has an edge, some or all of which is curved. These mask features may be represented by defining the location of the edge. For example, straight edges may be represented by their vertices, and curved edges may be represented by parameterization of the curves. This is a vector representation of the features, and this type of representation will be referred to as layers. For example, a mask layer is the vector representation of a lithographic mask.

However, the process for designing masks can be challenging if based solely on vector representations of the mask, the simulated lithography result and the target lithography result. In the approaches described herein, field representations (such as levelsets) are used. A field representation is an (x,y) array of values (the field) which represents the quantity of interest. For a mask feature, the value at each point in the field may be the distance from that point to the edge of the mask, and the sign of the value indicates whether the point lies in the interior of the feature. In one approach, rather than comparing the vector representations of the simulated and target results, the field representations of the two are compared to generate a correction field. This is propagated back to the field representation of the mask (the mask field), and then the mask field is converted to the corresponding modification of the mask layer.

Technical advantages of the present disclosure may include, but are not limited to, the following. The approach described herein can be faster than more conventional approaches to handling curved masks. Due to the simple mechanism, the computational cost of this approach is lower than that of more conventional approaches. It can also produce more consistent shapes of mask layers across different templates, reducing inter-template and intra-template inconsistencies. Additionally, as mask edge movements are influenced only by the difference between the levelsets of the simulated and target results, the patterns under the same geometrical environment pass through the same optimization trajectory.

The approach descried herein can also be more accurate than more conventional approaches. As the mask edges move responsive to the differences between the simulated and target levelsets, this results in corresponding mask edge movements, i.e., the majority patterns as well as the minority patterns (e.g., line ends) converge in a uniform and stable manner to the design target. This approach also provides that the maximum edge placement error (EPE) at the convergent point is reduced. Furthermore, it is robust to cases where no simulation result is generated for the initial mask layer, as well as when strong crosstalk between mask edges is induced by the lithography model.

Figure 2:
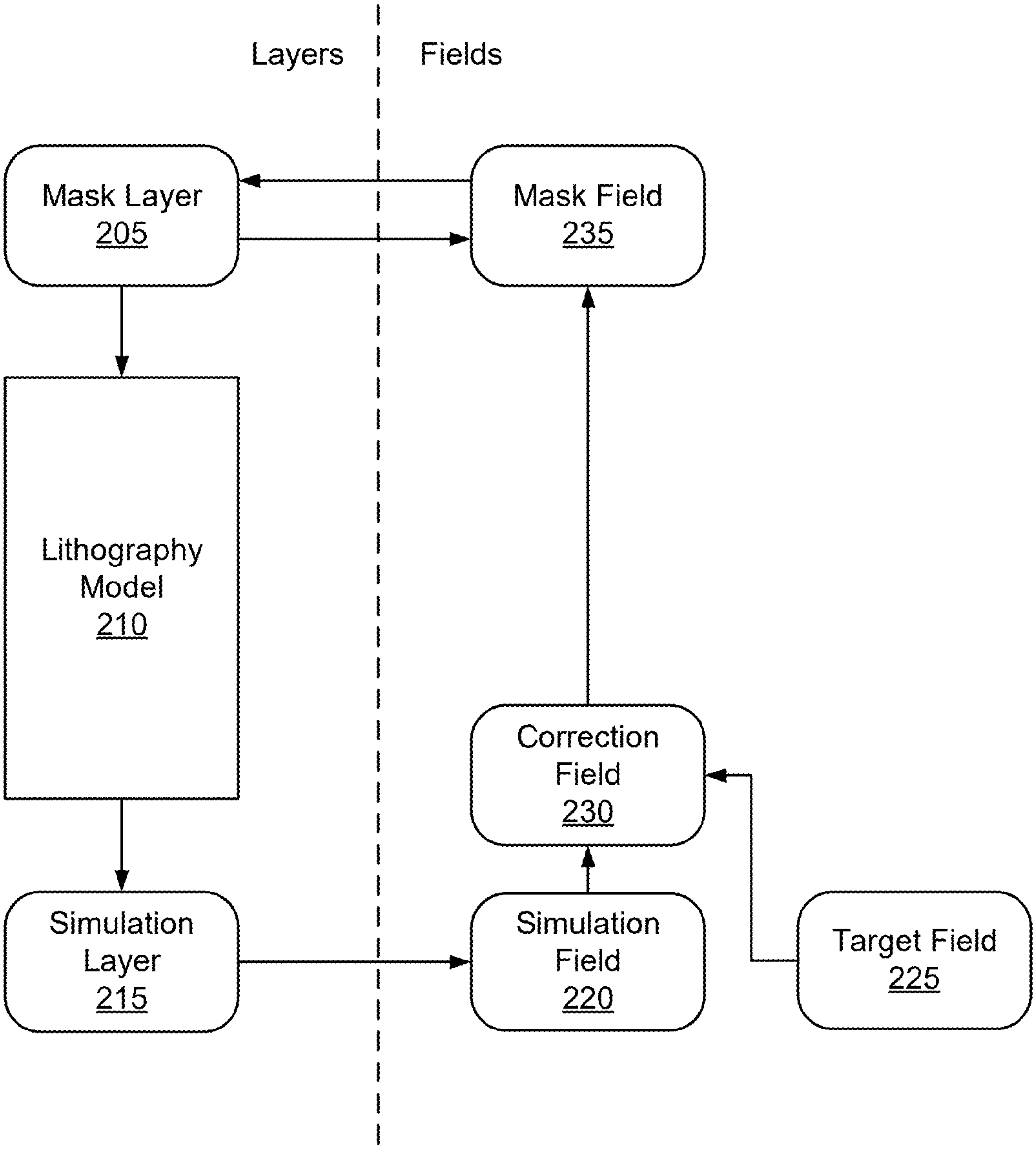
FIG. 2 is a block diagram of layers and field representations used in the mask layer design process of FIG. 1.

In more detail, FIG. 1 illustrates a flow diagram of operations of a mask layer design process in accordance with some embodiments of the present disclosure. FIG. 2 is a block diagram of layers and field representations used in the mask layer design process of FIG. 1. The left side of FIG. 2 shows the layers used in the mask layer design process and the right side of FIG. 2 shows the field representations used in the mask layer design process. At 105, the mask layer 205 is accessed. The mask layer 205 includes a vector representation of the lithographic mask. The lithographic mask may include many features, including one or more curved main features. The mask layer 205 may include a parameterized curve that represents the curved main feature of the mask layer 205. The curved main feature of the mask layer 205 may be curvilinear. The features of the lithographic mask may include assist features that are not modified during the mask layer design process, i.e., the assist features of the mask layer 205 are fixed. The mask layer 205 may be provided as an input to the lithography model 210. The lithography model 210 may include a forward function (e.g., for prediction of the wafer image) that generates the simulation layer 215 using the mask layer 205. The mask layer 205 may be also converted to the mask field 235 by computing, e.g., a levelset of the main feature of the mask layer 205. The simulation layer 215 obtained by the lithography model 210 may be converted to a field representation of the simulation layer 215, i.e., to the simulation field 220 by computing, e.g., a levelset function of the simulation layer 215.

At 110, the correction field 230 between the simulation field 220 and the target field 225 is computed. The simulation field 220 incudes a field representation of a simulated result of a lithography process using the lithographic mask. The target field 225 includes a field representation of a target result of the lithography process. The field representations utilized herein may be levelset representations of corresponding layers. A target layer that represents a vector representation of the target result may be further received at, e.g., 105. The target field 225 may be determined from the target layer at, e.g., 110. The target layer may include a curved main feature. The result of the lithography process may be one of: an aerial image, a latent image in resist, a resist structure, and a device structure. Simulation of the lithography process may produce a field representation rather than a vector representation.

At 115, the main feature of the mask field 235 is modified based on the correction field 230. The mask field 235 includes a field representation of the main feature of the lithographic mask. The mask field 235, the simulation field 220 and the target field 225 may include field representations of the main feature but not of the assist features. At 120, a processing device performing the mask layer design process modifies the main feature of the mask layer 205 based on the modification to the mask field 205. At 120, the modified main feature of the mask field 235 may be converted to the main feature of the mask layer 205 by applying a contour generation function with a defined threshold (e.g., equal to zero) to the modified main feature of the mask field 235.

The operations 110-120 of FIG. 1 are repeated for multiple iterations. A final version of the mask layer 205 is output from the multiple iterations of operations 110-120. The modification of the mask layer 205 as achieved by performing operations 105-120 may be incorporated as part of an Inverse Lithography Technology (ILT) process.

An initial correction field may be computed, at 110, by scaling a difference between the simulation field 220 and the target field 225. An inertia field may be further computed, at 110, by scaling a version of the correction field 230 computed in a previous iteration of the operation 110. The correction field 230 may be determined, at 110, by adding the inertia field to the initial correction field. In one or more embodiments, the simulation layer 215 that is a vector representation of the simulated result is computed by performing Boolean operations on the mask layer 205, an inner pseudo contour, and an outer pseudo contour. The inner pseudo contour may be generated by sizing down the target layer by an inner band. The outer pseudo contour may be generated by sizing up the target layer by an outer band.

Figure 3:
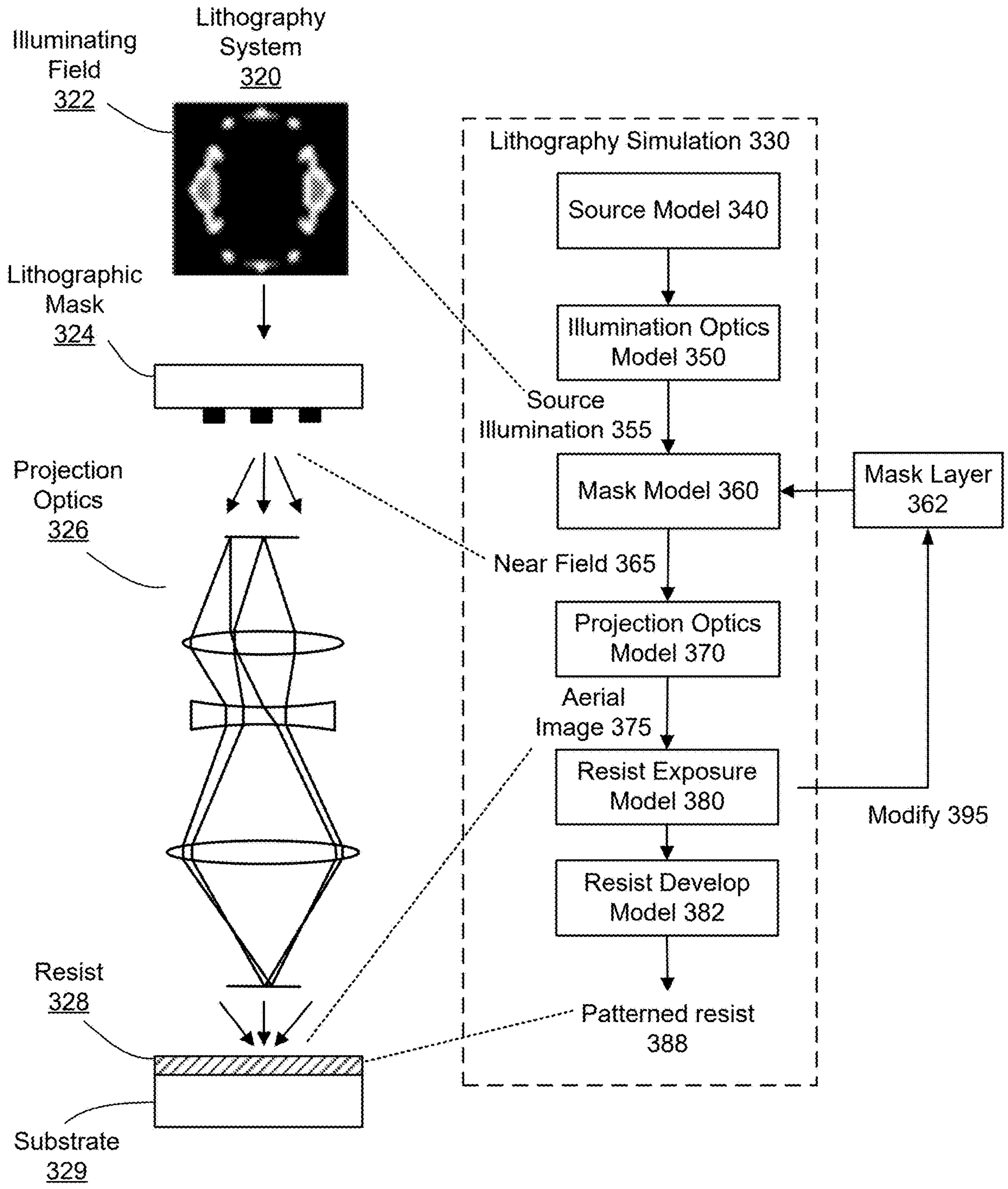
FIG. 3 is a flowchart of a computational lithography process in accordance with some embodiments of the present disclosure.

FIG. 3 is a flowchart of a computational lithography process in accordance with embodiments of the present disclosure. In this example, the computational lithography process is for design of a lithographic mask. The left side of FIG. 3 shows the lithography system 320 and the right side of FIG. 3 shows the computational lithography flow 330 for simulating that system. In the lithography system 320, a light source (not shown) produces a light distribution (the illuminating field 322) that is incident on a lithographic mask 324 that has a certain mask topology. Light from the illuminating field 322 propagates through the lithographic mask 324 or is reflected by the lithographic mask 324, resulting in a light distribution referred to as the near field. The near field is imaged by the projection optics 326 onto the resist 328 on the substrate 329 (e.g., a semiconductor wafer). The light distribution illuminating the resist 328 is referred to as the aerial image. The aerial image exposes a resist process (e.g., including exposure, post-exposure bake (PEB), and development) that results in a three-dimensional shape (profile) in the resist 328. Terms such as light and optical are meant to include all relevant wavelengths, including ultraviolet, deep ultraviolet and extreme ultraviolet, and are not limited to just visible wavelengths.

The right side of FIG. 3 shows the computational lithography flow 330 that simulates the lithography system 320, including modifying a design of a lithographic mask, according to embodiments of the present disclosure. The dashed box 330 includes simulations or models of the overall lithography configuration. For convenience, separate boxes are shown to correspond to physical components or processes, but the simulations need not be implemented in this way. For example, the source model 340 represents a model of the source and the illumination optics models 350 models the effect of illumination optics. These generate the source illumination 355, which is an estimate of the source illumination 322 incident on the mask. However, actual simulation may or may not use separate models 340, 350 for the source and optics. In some cases, the two may be combined into a single model or simulation that predicts the source illumination 355.

The mask model 360 models the effect of the lithographic mask 324 on the incident illumination 322. Here, the lithographic mask 324 is represented by the mask layer 362. The projection optics model 370 represents the effect of optics 326. The source illumination 355 is filtered by the mask model 360. The resulting field is referred to as the near field 365. This is applied to the model 370 of the projection optics to estimate the aerial image 375 that exposes the resist 328 on the wafer 329. The resist 328 is modeled by the resist exposure model 380 and the resist development model 382, resulting in an estimate of the patterned resist 388. Additional modeling may be used to predict etching, doping, deposition or other semiconductor fabrication processes. One or more portions of the mask model 360, the projection optics model 370, the resist exposure model 380, and/or the resist development model 382 may form the lithography model 210 in FIG. 2. The near field 365, the aerial image 375 and/or the patterned resist 388 may be an embodiment of the simulation layer 215.

Various results of the lithography simulation 330 may be used to modify 395 the mask layer 362. For example, the predicted near field 365 may be analyzed and then used to modify 395 the mask layer 362. The aerial image 375 and the patterned resist 388 may also be used for this purpose. In some embodiments, the simulation field 220 obtained from the simulation layer 215, the target field 225 and the correction field 230 are utilized to modify 395 the mask layer 362.

Metrics derived from these quantities may also be used. One example is the difference between the predicted aerial image 375 and a desired aerial image. Differences between other predicted signals (e.g., the near field 365) and the desired signal may also be used. Differences between the predicted locations of the edges of the patterned resist 388

(resist contours) and the desired locations of those edges is another example. This may be referred to as edge placement error.

As another example, one measure of the quality of patterned resist 388 is the critical dimension (CD). The CD is the dimension of certain features in the patterned resist 388. Typically, the CD is the smallest line width or space width printed in the resist 388. As such, the CD is a measure of the resolution of the resist 388 and lithography process. The models in the lithography simulation 330 may be used to predict the CDs for a given lithography configuration. The predicted CD may be used to modify 395 the mask layer 362.

Another measure of the quality of patterned resist 388 is defects. Examples of defects include when two printed lines that are supposed to be separate are merged, when a printed line that is supposed to be continuous has a break, and when a printed feature that is supposed to have a hole in the center is actually filled in. Predicted defects and defect rate may also be used to modify 395 the mask layer 362. Other metrics may be based on the differences between a desired and a predicted result.

In the computational lithography process 330, various layouts may be represented by parametric curves, rather than rectilinear polygons. For example, the mask layer 362 itself includes many shapes, some or many of which may be represented by parametric curves. The source illumination 355, near field 365 and aerial image 375 may also be represented by parametric curves. These quantities are two-dimensional intensity profiles. Parametric curves may be used to represent contours of constant intensity. The patterned resist 388 may also be represented by parametric curves. The resist 388 itself is a three-dimensional shape. The resist 388 may be represented by contours at different heights of the resist 388. Both the simulated quantities shown in the computational lithography process 330 and the desired target outcomes may be represented by parametric curves.

Figure 4A:
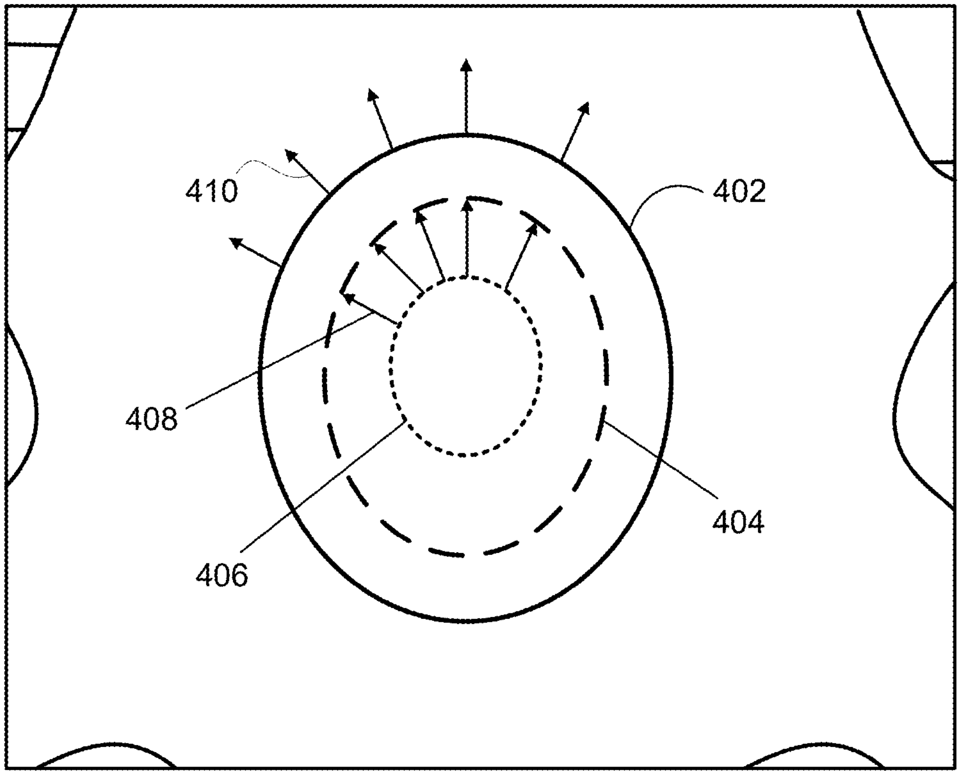
FIG. 4A illustrates multiple layers that are defined for the mask layer design process in accordance with some embodiments of the present disclosure.

FIG. 4A illustrates multiple layers defined for the mask layer design process presented herein. As shown in FIG. 4A, three different layers can be defined—the mask layer 402 (i.e., initial mask layer), the target layer 404 (e.g., rounded target result), and the simulation layer 406. In order to achieve a smooth shape of the curved mask, the target layer 404 can be defined to be of the rounded shape. The target layer 404 is fixed across the iterative mask layer design process, while the mask layer 402 and the simulation layer 406 are updated in each iteration. The arrow 408 illustrates a shortest distance from a given location of the simulation layer 406 to the target layer 404, i.e., a difference between the simulation field (e.g., levelset of the simulation layer 406) and the target field (e.g., levelset of the target layer 404). The arrows 410 illustrate the momentum of the mask edge movement, i.e., the momentum of the correction applied to the mask layer 402.

Figure 4B:
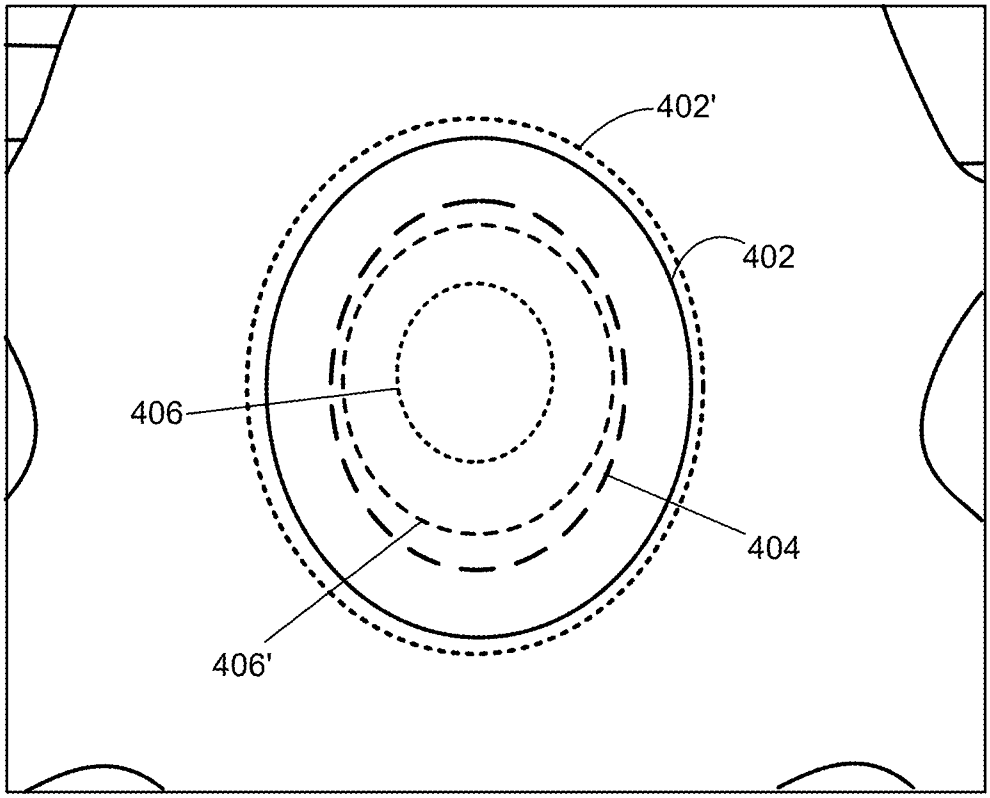
FIG. 4B illustrates the principle of mask edge movements in accordance with some embodiments of the present disclosure.

FIG. 4B illustrates the principle of the mask edge movement during the mask layer design process presented herein. The mask edge movement represents movement of the mask layer 402 to the updated mask layer 402' when the simulation layer 406 moves to the simulation layer 406', i.e., the simulation layer 406 moves closer to the target layer 404. The mask edge movement at a certain location of the mask layer 402 may be proportional to the shortest distance from the simulation layer 406 to the target layer 404. The shortest distance may be computed by subtracting the simulation field from the target field, e.g., by subtracting the levelset of the simulation layer 406 from the levelset of the target layer 404.

Figure 5:
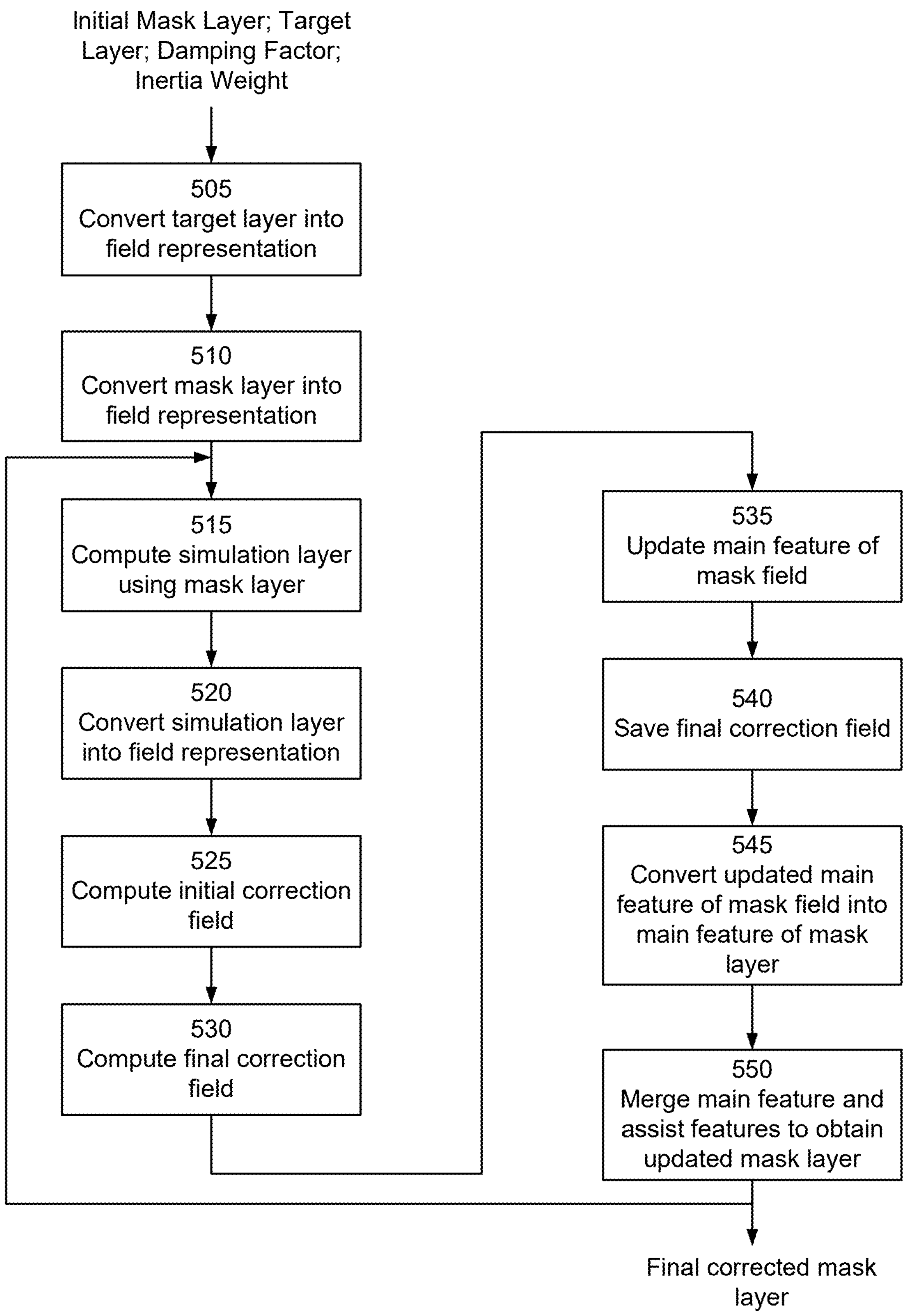
FIG. 5 is a detailed flow diagram of an iterative mask layer design process in accordance with some embodiments of the present disclosure.
Figure 6A:
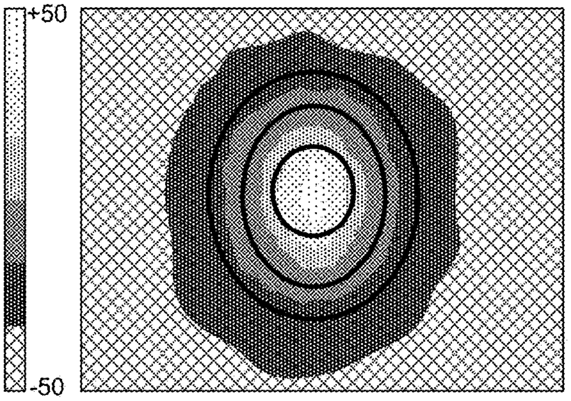
FIG. 6A illustrates a field representation (e.g., levelset) of the target layer during the mask layer design process of FIG. 5.
Figure 6B:
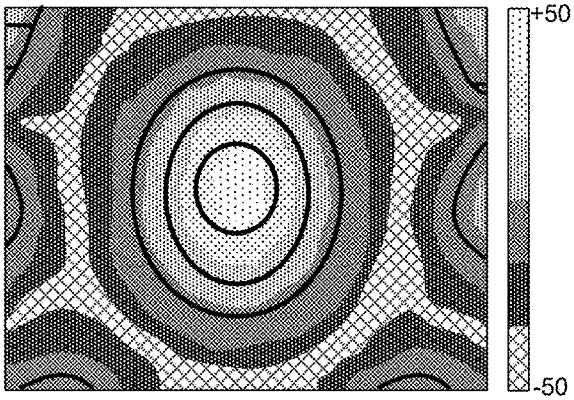
FIG. 6B illustrates the field representation of main feature of the mask layer during the mask layer design process of FIG. 5.

FIG. 5 is a flow diagram of an iterative mask layer design process performed during synthesis of the curved mask (e.g., curvilinear mask or some other type of curved mask). The initial mask layer ('layer_mask'), the rounded target layer ('layer_target'), the damping factor ('damp_f') and the inertia weight ("inert_wt") are predetermined and represent inputs to the iterative mask layer design process. At 505, the target layer is converted into the field representation (e.g., levelset) of the target layer ('lset_target'), i.e., L(target_layer)→ lset_target, where L( ) is a function (e.g., signed distance function) that converts a layer to a levelset. The target field (e.g., levelset of the target layer) is shown in FIG. 6A for the levelset values between, e.g.,-50 and +50. At 510, the initial mask layer is converted into the field representation (e.g., levelset) of the mask layer. In one or more embodiments, only the main feature of the initial mask layer ('layer_mask_MF') is converted into the levelset of the main feature of the mask layer ('lset_mask_MF'), i.e., L(layer_mask_MF)→lset_mask_MF. The mask field (i.e., levelset of the mask layer with the main feature and assist features) is shown in FIG. 6B for the levelset values between, e.g., −50 and +50.

Figure 6C:
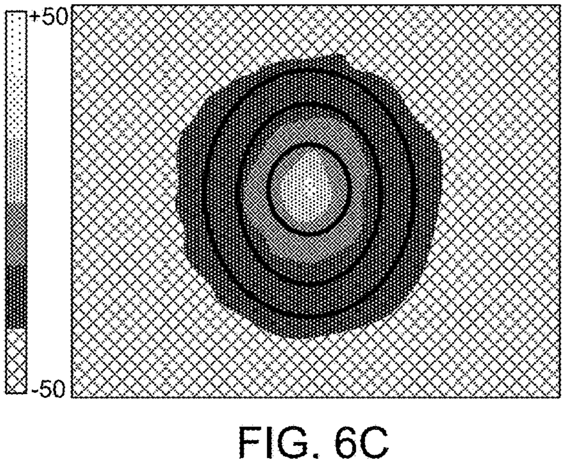
FIG. 6C illustrates the field representation of the simulation layer during the mask layer design process of FIG. 5.

At 515, the simulation layer ('layer_simulation') is computed using the current mask layer, i.e., F(layer_mask)→layer_simulation, where F( ) is a forward function of the lithography model for, e.g., prediction of the wafer image. At 520, the simulation layer is converted into the field representation (e.g., levelset) of the simulation layer ('lset_simulation'), i.e., L(layer_simulation)→lset_simulation. The example levelset of the simulation layer is shown in FIG. 6C for the levelset values between, e.g., −50 and +50.

Figure 6D:
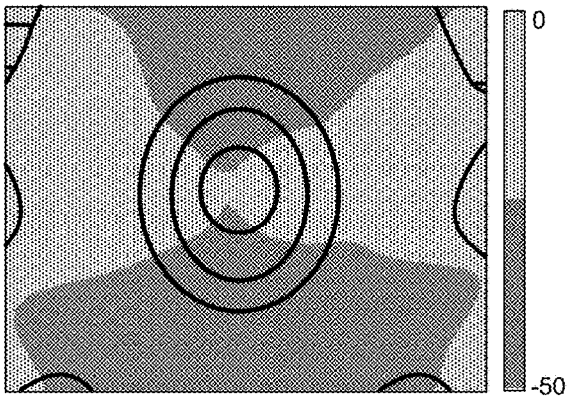
FIG. 6D illustrates the field representation of the correction layer during the mask layer design process of FIG. 5.

At 525, the initial correction field is computed. The correction field represents a difference between the field representation (e.g., levelset) of the simulation layer and the field representation (e.g., levelset) of the target layer. The initial correction field ('lset_correction_0') is computed as a difference between the field representation (e.g., levelset) of the simulation layer and the field representation (e.g., levelset) of the target layer, and by scaling the computed difference by the damping factor (e.g., less than 1), i.e., lset_correction_0<damp_f*(lset_simulation-lset_target). At 530, the final correction field ('lset_correction') is computed by adding the inertia field represented by the inertia weight ('inertia_wt') to the initial correction field, i.e., lset_correction←lset_correction_0+ inertia_wt*lset_correction_cached. Note that 'lset_correction_cached' is the correction field that is saved (or cached) for the next iteration. Note that no correction field is saved before the start of the first iteration, i.e., the inertia field is not applied to the correction field in the first iteration. The difference between the levelset of the simulation layer and the levelset of the target layer, i.e., the correction field is shown in FIG. 6D for the levelset values between, e.g.,-50 and 0.

Figure 6E:
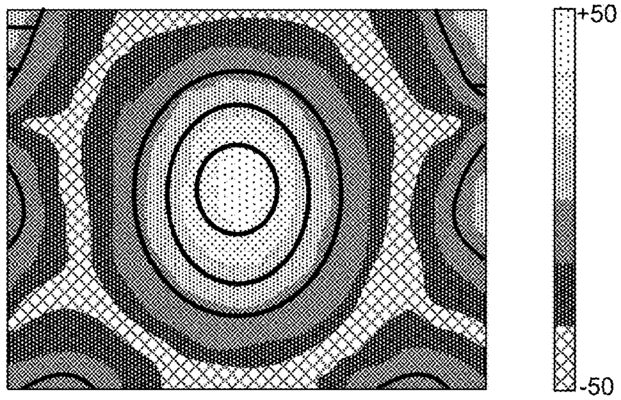
FIG. 6E illustrates the field representation of the main feature of the corrected mask layer at the end of the mask layer design process of FIG. 5.

At 535, the main feature of the mask field (e.g., levelset of the main feature of the mask layer) is updated. The levelset of the main feature of the mask layer ('lset_mask_MF') is updated by subtracting the correction field from the levelset of the main feature of the mask layer computed at 510, i.e., lset_mask_MF←lset_mask_MF−lset_correction. The levelset of the updated mask layer with the updated main feature and fixed assist features is shown in FIG. 6E for the levelset values between, e.g.,-50 and +50.

At 540, the correction field is saved (or cached) for the next iteration (for the step 525 of the next iteration), i.e., lset_correction_cached←lset_correction. At 545, the updated main feature of the mask field (e.g., levelset of the updated main feature of the mask layer) is converted into the main feature of the mask layer ('layer_mask_MF'), i.e., M(lset_mask_MF)→layer_mask_MF, where M( ) is a function that converts a levelset to a layer. The function M( ) may be a contour generation function with a threshold level of, e.g., zero.

At 550, the assist features of the mask layer (that are fixed) are merged with the updated main feature of the mask layer to obtain the updated mask layer, i.e., layer_mask layer_mask_MF+layer_mask_AF. After that, the steps 515-550 are repeated until a number of iterations reaches a predetermined value or until the simulation layer reaches the target layer within a predefined margin. At 550 of the last iteration, the updated mask layer represents the final corrected mask layer, i.e., the designed curved mask.

In some embodiments, instead of employing field representations (e.g., levelset functions), operations in FIG. 5 can be performed directly on layers. In particular, instead of applying the correction field to the mask field, the correction field defined as a difference between the simulation field and the target field can be applied directly to the mask layer. In such cases, the mask edge movement may be responsive directly to the difference between the simulation field and the target field, i.e., to the correction field that is updated during each iteration.

Figure 7A:
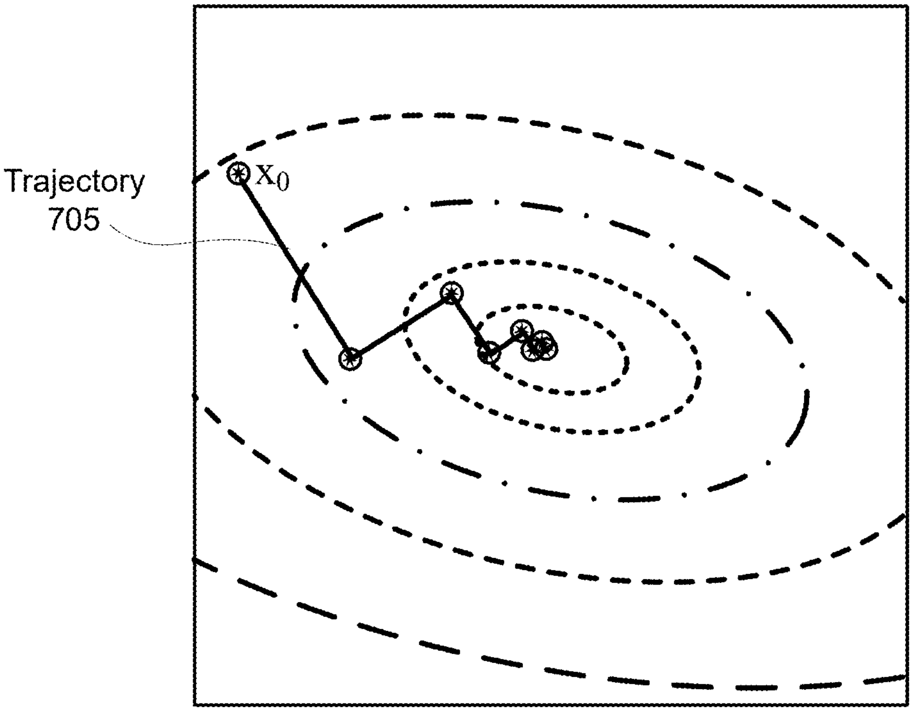
FIG. 7A illustrates the convergence trajectory of the iterative mask layer design process without applying the inertia field in accordance with some embodiments of the present disclosure.

The lithography model employed at 515 of FIG. 5 for generating the simulation layer from the mask layer (e.g., the lithography model 210) may introduce strong crosstalk between the mask edges. The strong crosstalk may cause oscillations in the movement of the correction field (and, equivalently, cause oscillations in the movement of the mask edges) resulting into a larger number of iterations of the mask layer design process, i.e., into a lengthy runtime of the mask layer design process and possible convergence fail. FIG. 7A illustrates the convergence trajectory of the iterative mask layer design process without applying the inertia field. The point $x_0$ in FIG. 7A is the initial location in the mask search space, and the trajectory 705 represents the trajectory of the location in the mask search space during the iterative mask layer design process. It can be observed that the trajectory 705 of the location in the mask search space oscillates during the iterative mask layer design process due to the strong crosstalk between the mask edges, resulting into additional iterations required for convergence to a target location (i.e., convergence point).

To address this convergence problem, the inertia field is applied during the iterative mask layer design process of FIG. 5 (e.g., at the step 530 for computation of the final correction field). The inertia field prevents the movements of mask edges from oscillating when the level of crosstalk is high. The inertia field at the current iteration N can be computed by the scalar multiplication of the correction field at the previous iteration N−1 and the inertia weight (which is a predetermined value). The correction field at the current iteration is updated as:

$$\text{lset\_correction}[N] = \text{damp\_f} * (\text{lset\_sim\_contour}[N] - \text{lset\_target}) + \text{lset\_inertia\_field}[N], \tag{1}$$

and the inertia field at the current iteration is computed by:

$$\text{lset\_inertia\_field}[N] = \text{inertia\_wt} * \text{lset\_correction}[N-1]. \tag{2}$$

Figure 7B:
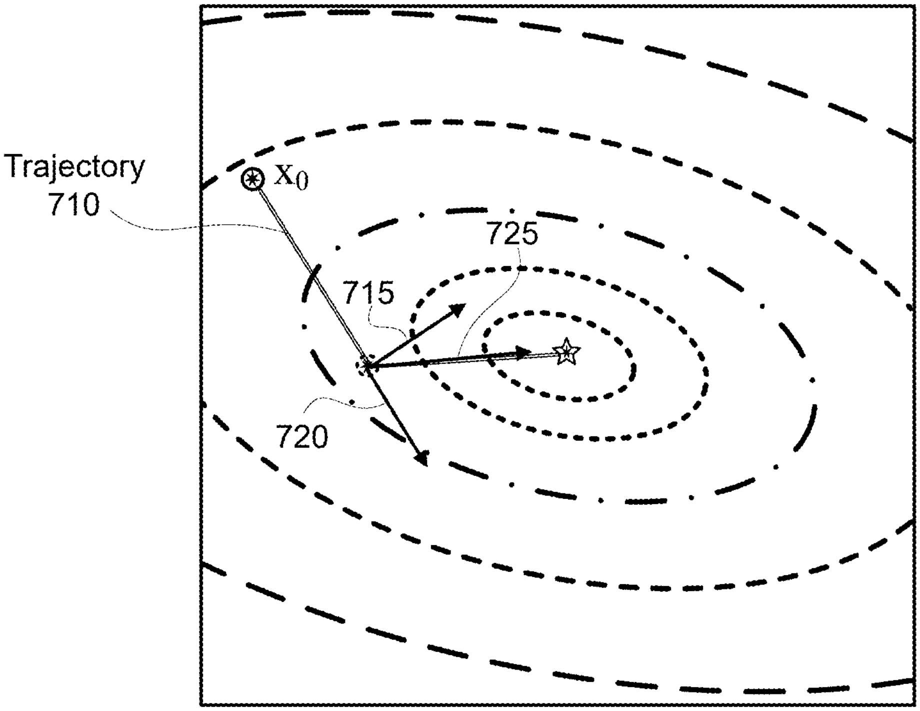
FIG. 7B illustrates the convergence trajectory of the iterative mask layer design process when the inertia field is applied in accordance with some embodiments of the present disclosure.

FIG. 7B illustrates the convergence trajectory of the iterative mask layer design process of FIG. 5 when the inertia field is applied. The point $x_0$ in FIG. 7B is the initial location in the mask search space, and the trajectory 710 is the trajectory of the location in the mask search space during the iterative mask layer design process of FIG. 5. It can be observed from FIG. 7B that due to the vector 715 of delta levelset direction (i.e., direction of the difference between the levelset of the simulation layer and the levelset of the target layer) and the vector 720 of direction of the inertia field, direction of the combined vector 725 is directly positioned toward the target location. Due to the inertia field that is applied, the trajectory 710 of the location in the mask search space does not oscillate during the iterative mask layer design process of FIG. 5, resulting into less iterations for convergence to the target location.

Figure 8:
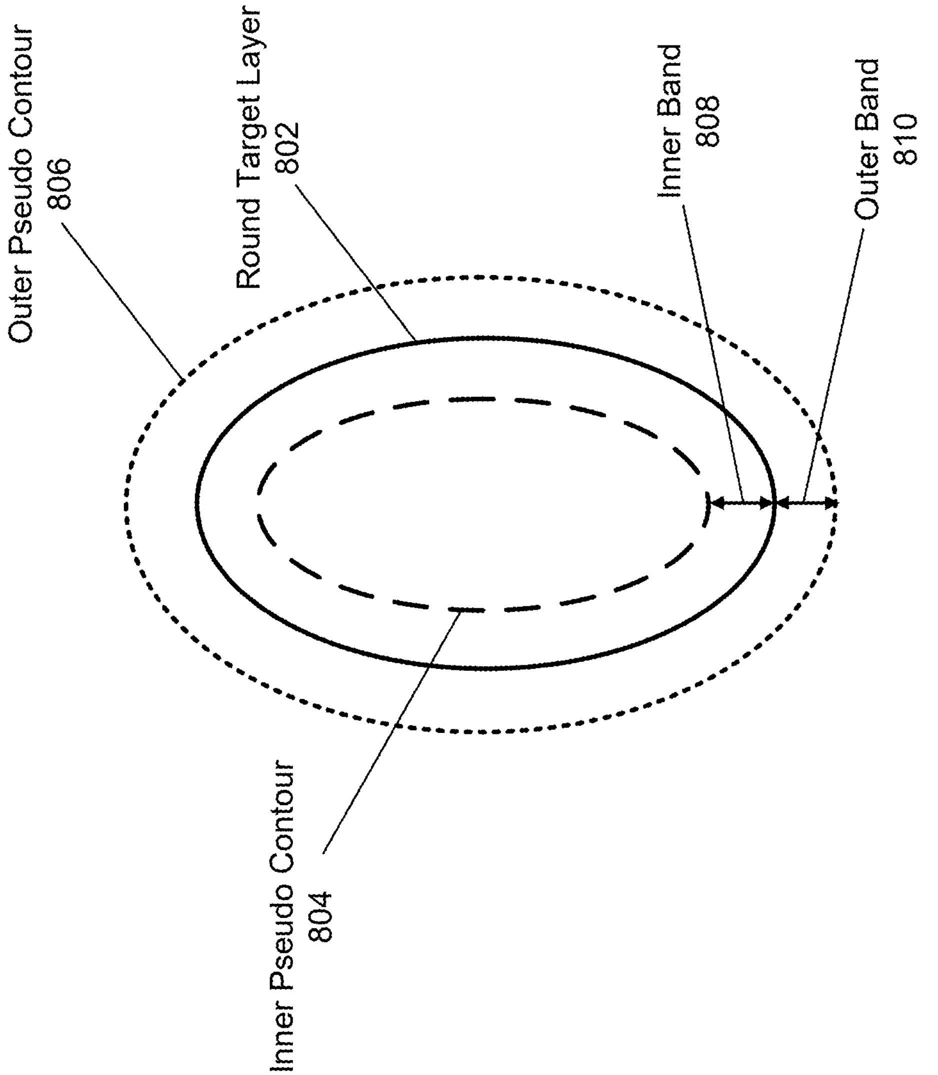
FIG. 8 illustrates an example target layer, an inner pseudo contour and an outer pseudo contour in accordance with some embodiments of the present disclosure.

During the iterative mask layer design process of FIG. 5, the mask edge movement is driven by the difference between the levelset of the simulation layer and the levelset of the target layer. However, in some cases, at step 515, the initial mask layer may not generate the simulation layer, resulting in no mask edge movement. In order to handle the "no simulation layer" cases, the notion of "pseudo contour" is introduced herein. In particular, two types of pseudo contours are defined—the inner pseudo contour and the outer pseudo contour. FIG. 8 illustrates the example rounded target layer 802, the inner pseudo contour 804 and the outer pseudo contour 806. To compute the inner and outer pseudo contours 804 and 806, the inner band 808 and the outer band 810 are defined. The inner band 808 is the gap between the inner pseudo contour 804 and the rounded target layer 802, and the outer band 810 is the gap between the outer pseudo contour 806 and the rounded target layer 802. The inner pseudo contour 804 can be then computed by sizing down the rounded target layer 802 by the inner band 808, and the outer pseudo contour 806 can be then computed by sizing up the rounded target layer 802 by the outer band 810.

The final pseudo contour is synthesized by performing Boolean operations on the inner pseudo contour 804, the outer pseudo contour 806 and the simulation layer (if any) as defined by:

$$\text{final pseudo contour} = [(\text{simulation layer OR inner pseudo contour}) \text{ AND outer pseudo contour}]. \tag{3}$$

Different shapes of the final pseudo contours synthesized using the inner pseudo contour and the outer pseudo contour are illustrated in FIGS. 9A through 9E. The final pseudo contour synthesized by applying operations of equation (3) can be referred to herein as "synthesized simulation layer" which can be used in the iterative mask layer design process of FIG. 5 instead of "simulation layer".

Figure 9A:
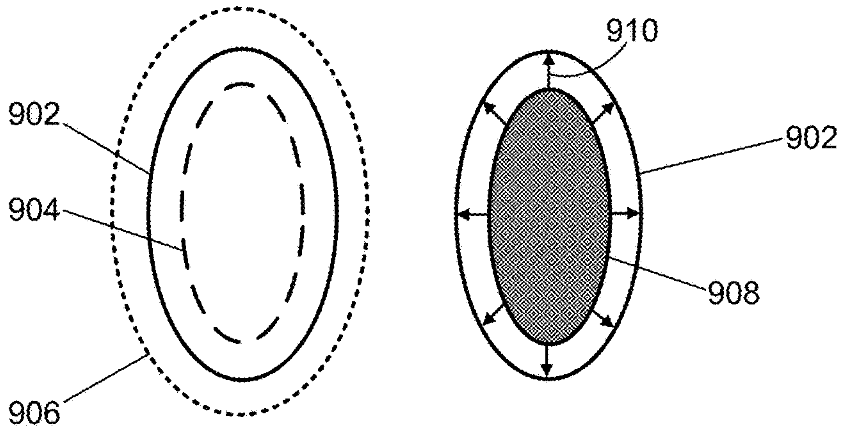
FIG. 9A illustrates the synthesized simulation layer when no simulation layer is initially generated in accordance with some embodiments of the present disclosure.

FIG. 9A illustrates the synthesized simulation layer when no simulation layer is initially generated from the initial mask layer. The target layer 902, the inner pseudo contour 904, and the outer pseudo contour 906 are predetermined and precomputed. The synthesized simulation layer 908 is generated using the inner pseudo contour 904 and the outer pseudo contour 906, as given by equation (3). The arrows 910 in FIG. 9A illustrate the strictly outward momentum of the mask edge movements during the iterative mask layer design process of FIG. 5, which is responsive to the convergence of the synthesized simulation layer 908 toward the target layer 902.

Figure 9B:
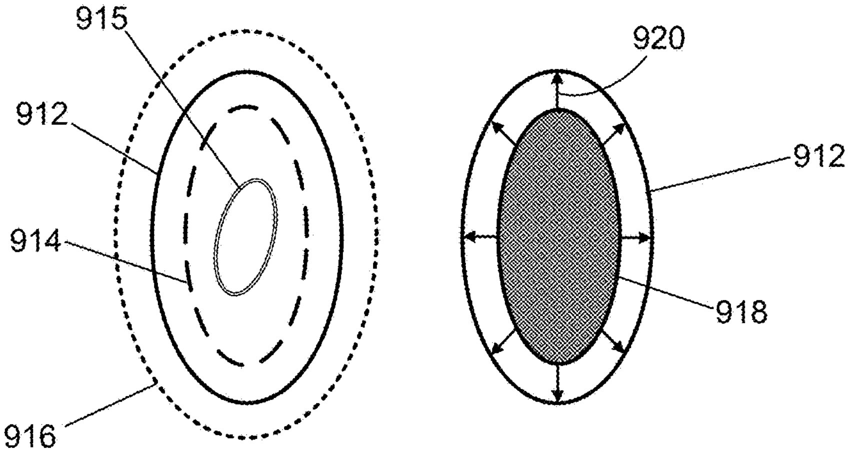
FIG. 9B illustrates the synthesized simulation layer when the initial simulation layer is covered by an inner pseudo contour in accordance with some embodiments of the present disclosure.

FIG. 9B illustrates the synthesized simulation layer when the initial simulation layer is covered by an inner pseudo contour. The target layer 912, the inner pseudo contour 914, and the outer pseudo contour 916 are predetermined and precomputed. As shown in FIG. 9B, the initial simulation layer 915 generated from the initial mask layer is entirely covered by the inner pseudo contour 914. The synthesized simulation layer 918 is generated using the inner pseudo contour 914, the outer pseudo contour 916 and the initial simulation layer 915, as given by equation (3). The arrows 920 in FIG. 9B illustrate the strictly outward momentum of the mask edge movements during the iterative mask layer design process of FIG. 5, which is responsive to the convergence of the synthesized simulation layer 918 toward the target layer 912.

Figure 9C:
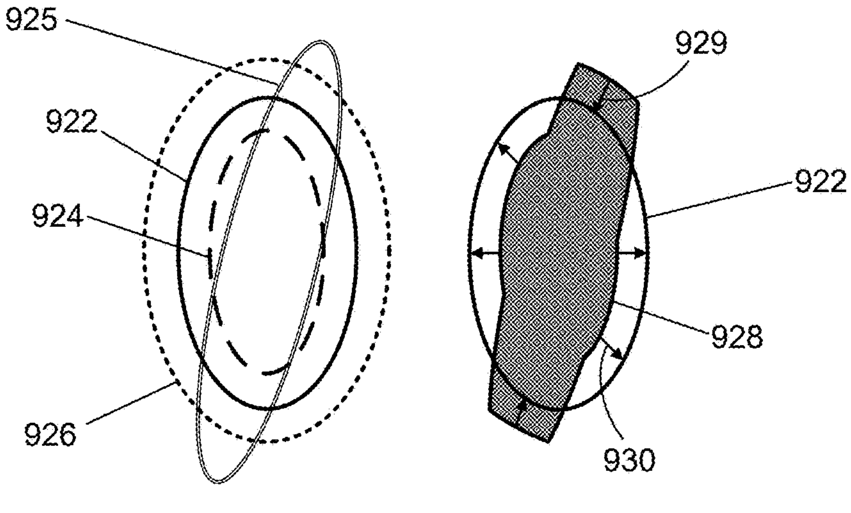
FIG. 9C illustrates the synthesized simulation layer when the initial simulation layer intersects inner and outer pseudo contours in accordance with some embodiments of the present disclosure.

FIG. 9C illustrates the synthesized simulation layer when the initial simulation layer intersects inner and outer pseudo contours. The target layer 922, the inner pseudo contour 924, and the outer pseudo contour 926 are predetermined and precomputed. As shown in FIG. 9C, the initial simulation layer 925 generated from the initial mask layer intersects both the inner pseudo contour 924 and the outer pseudo contour 926. The synthesized simulation layer 928 is generated using the inner pseudo contour 924, the outer pseudo contour 926 and the initial simulation layer 925, as given by equation (3). As shown in FIG. 9C, the synthesized simulation layer 928 intersects the target layer 922. The arrows 929 illustrate the inward momentum of the mask edge movements and the arrows 930 illustrate the outward momentum of the mask edge movements during the iterative mask layer design process of FIG. 5. Both the inward and outward momentums are responsive to the corresponding convergence of the synthesized simulation layer 928 toward the target layer 922.

Figure 9D:
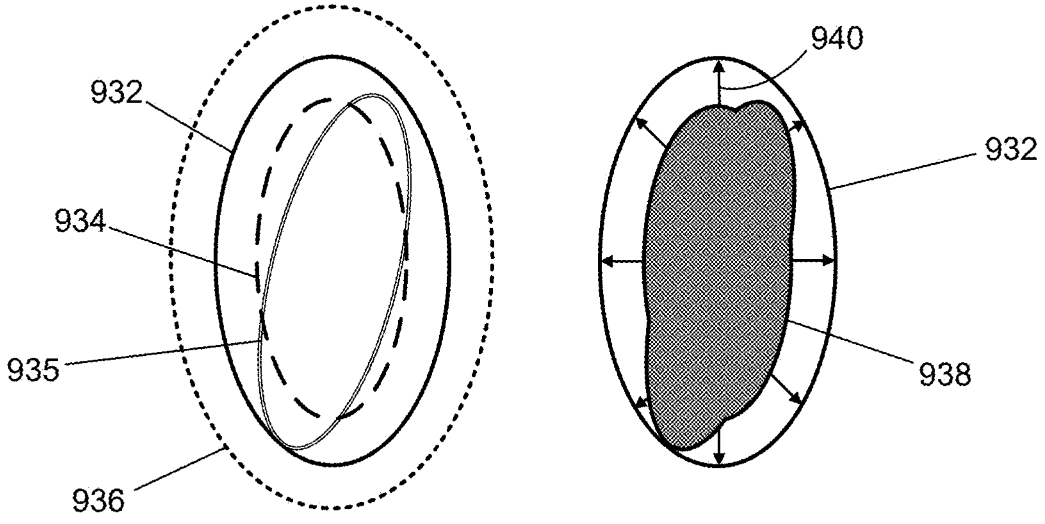
FIG. 9D illustrates the synthesized simulation layer when the initial simulation layer intersects the inner pseudo contour in accordance with some embodiments of the present disclosure.

FIG. 9D illustrates the synthesized simulation layer when the initial simulation layer intersects the inner pseudo contour. The target layer 932, the inner pseudo contour 934, and the outer pseudo contour 936 are predetermined and precomputed. As shown in FIG. 9D, the initial simulation layer 935 generated from the initial mask layer intersects the inner pseudo contour 934 but not the outer pseudo contour 936. The synthesized simulation layer 938 is generated using the inner pseudo contour 934, the outer pseudo contour 936 and the initial simulation contour 935, as given by equation (3). The arrows 940 in FIG. 9D illustrate the strictly outward momentum of the mask edge movements during the iterative mask layer design process of FIG. 5, which is responsive to the convergence of the synthesized simulation layer 938 toward the target layer 932. However, it should be noted that the intensity of the outward momentum is not uniform across different locations of the synthesized simulation layer 938 as, at some locations, the synthesized simulation layer 938 is closer to the target layer 932 than at some other locations.

Figure 9E:
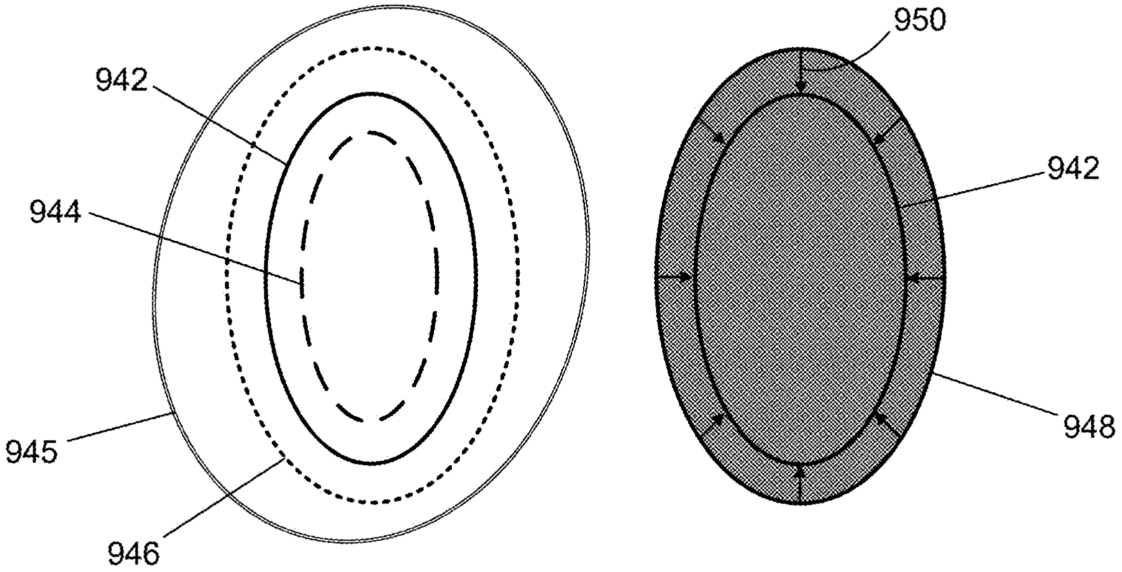
FIG. 9E illustrates the synthesized simulation layer when the initial simulation layer covers the outer pseudo contour in accordance with some embodiments of the present disclosure.

FIG. 9E illustrates the synthesized simulation layer when the initial simulation layer covers the outer pseudo contour. The target layer 942, the inner pseudo contour 944, and the outer pseudo contour 946 are predetermined and precomputed. As shown in FIG. 9E, the initial simulation layer 945 generated from the initial mask layer entirely covers the outer pseudo contour 946. The synthesized simulation layer 948 is generated using the inner pseudo contour 944, the outer pseudo contour 946 and the initial simulation layer 945, as given by equation (3). The arrows 950 in FIG. 9E illustrate the strictly inward momentum of the mask edge movements during the iterative mask layer design process of FIG. 5, which is responsive to the convergence of the synthesized simulation layer 948 toward the target layer 942.

Figure 10A:
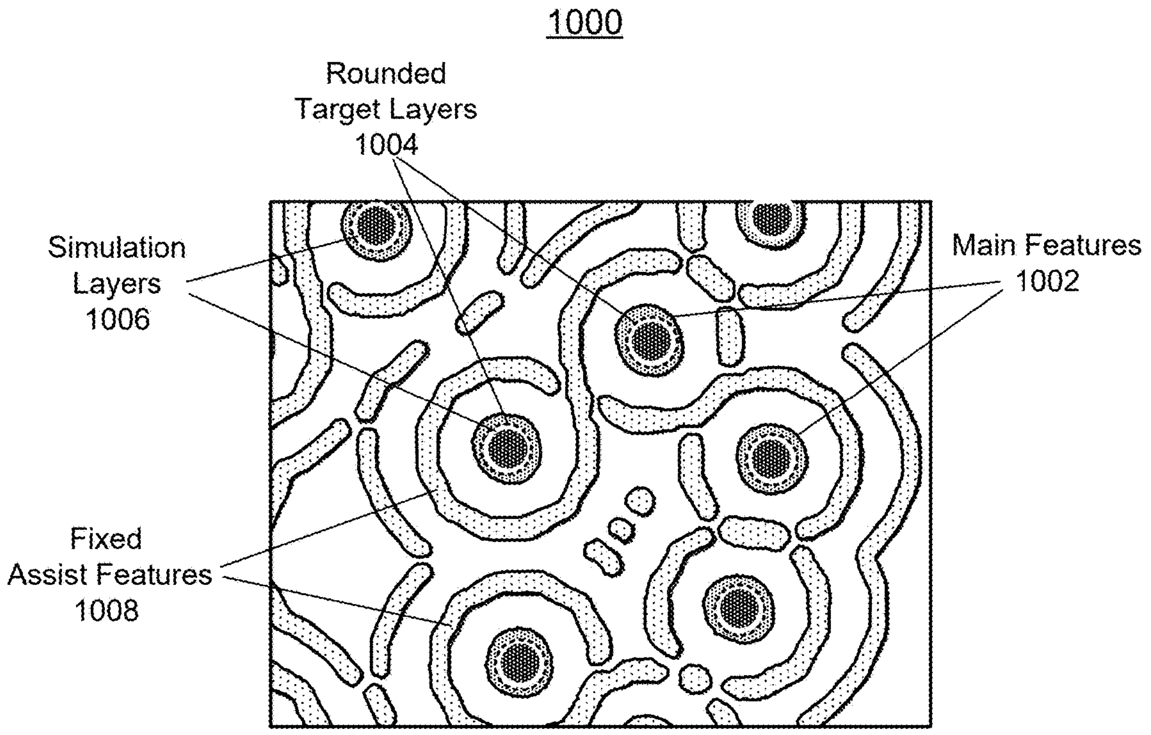
FIG. 10A illustrates an example first clip of the contact layer with designed mask layers exhibited overlapping with rounded target layers in accordance with some embodiments of the present disclosure.
Figure 10B:
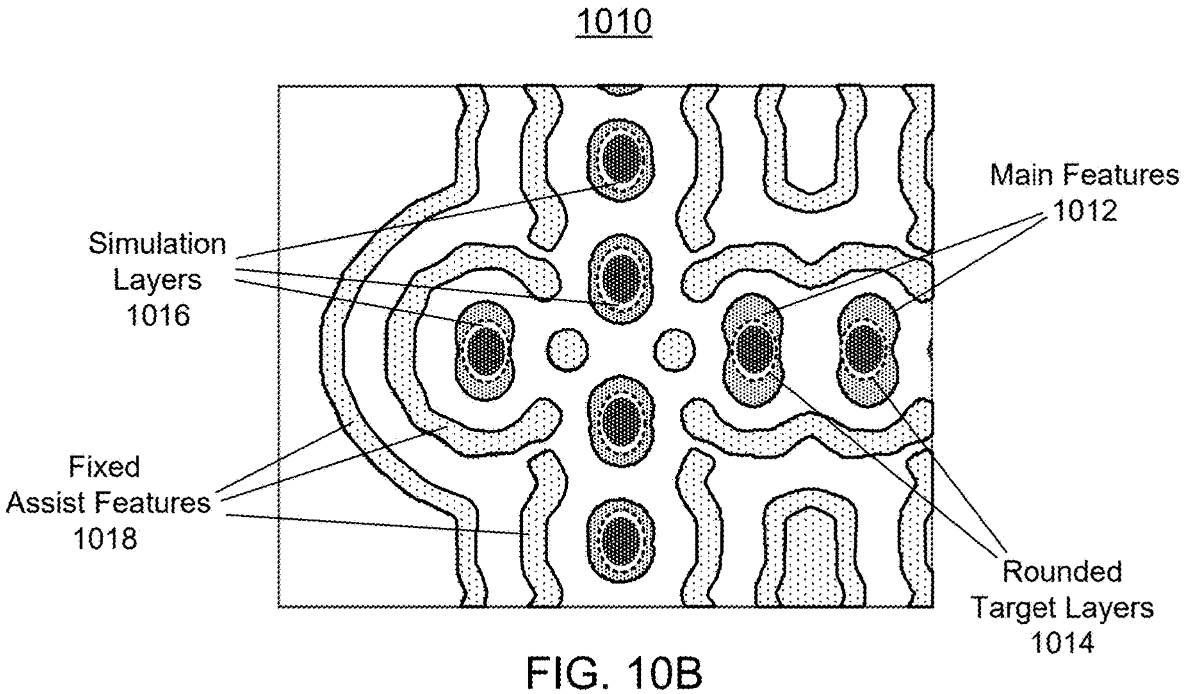
FIG. 10B illustrates an example second clip of the contact layer with designed mask layers exhibited overlapping with rounded target layers in accordance with some embodiments of the present disclosure.

The iterative mask layer design process presented herein is prototyped and tested using a pair of clips of a contact layer. FIG. 10A illustrates the clip of the contact layer 1000 with designed main features of mask layers 1002 exhibited overlapping with the rounded target layers 1004, the simulation layers 1006 and the fixed assist features of mask layers 1008. It can be observed from FIG. 10A that the simulation layers 1006 substantially overlap the rounded target layers 1004 for different patterns confirming convergence of the iterative mask layer design process presented herein for different mask patterns. Similarly, FIG. 10B illustrates the clip of the contact layer 1010 with designed main features of mask layers 1012 exhibited overlapping with the rounded target layers 1014, the simulation layers 1016 and the fixed assist features of mask layers 1018. It can be observed from FIG. 10B that the simulation layers 1016 substantially overlap the rounded target layers 1014 for different patterns confirming convergence of the iterative mask layer design process presented herein for different mask patterns.

Figure 11A:
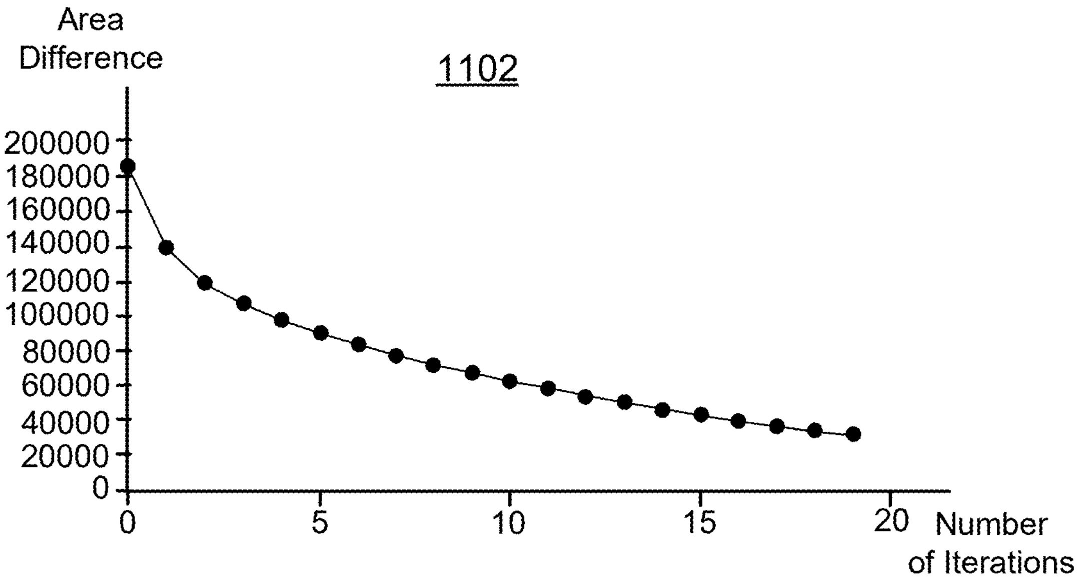
FIG. 11A is an example graph of the area difference between the rounded target layer and the simulation layer for the contact layer of FIG. 10A.
Figure 11B:
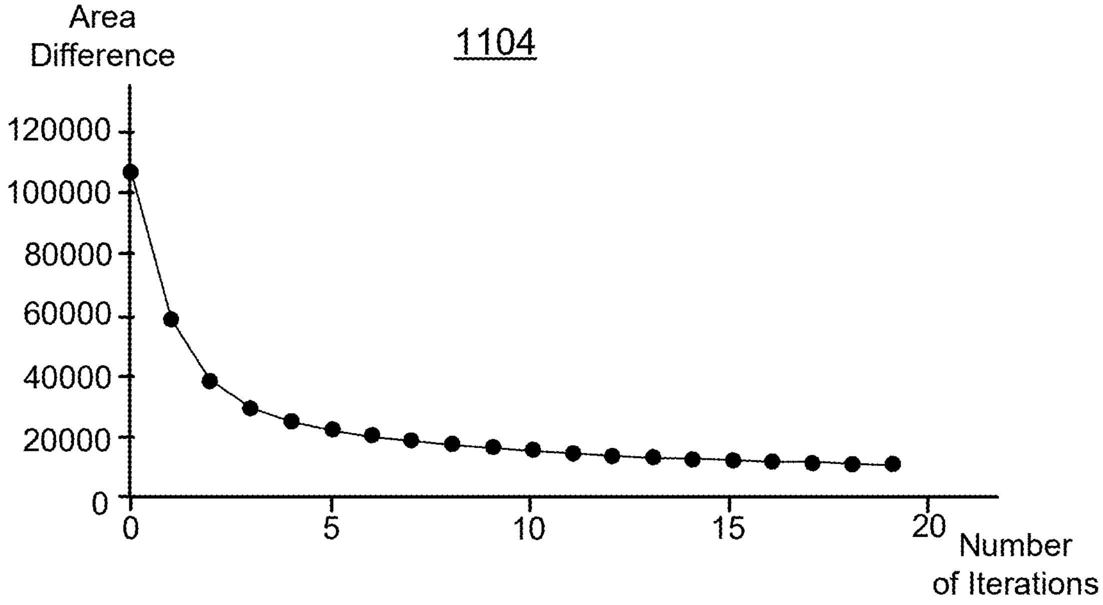
FIG. 11B is an example graph of the area difference between the rounded target layer and the simulation layer for the contact layer of FIG. 10B.

To assess the convergence stability, the area difference between the target layer and the simulation layer is measured as a function of the number of iterations of the iterative mask layer design process presented herein. FIG. 11A is an example graph 1102 of the area difference between the rounded target layer 1004 and the simulation layer 1006 for the clip of the contact layer 1000 of FIG. 10A. FIG. 11B is an example graph 1104 of the area difference between the rounded target layer 1014 and the simulation layer 1016 for the clip of the contact layer 1010 of FIG. 10B. In both cases, the area difference decays monotonically when increasing the number of iterations of the presented mask layer design process.

The iterative mask layer design process presented herein (also referred to herein as "Levelset Solver") is benchmarked herein against several conventional mask synthesis solutions, i.e., the first ILT (Inverse Lithography Technology) algorithm, the second ILT algorithm, the third ILT algorithm, and the OPC (Optical Proximity Correction) algorithm. Comparisons of runtimes (i.e., turnaround times (TATs)), maximum EPEs, minimum EPEs and mean absolute EPEs are shown in FIG. 12A for the clip of the contact layer 1000 of FIG. 10A and in FIG. 12B for the clip of the contact layer 1010 of FIG. 10B. It can be observed that in both cases the "Levelset Solver" presented herein outperforms the conventional mask synthesis solutions in terms of both the runtime (i.e., speed) and the mean absolute EPE (i.e., convergence accuracy).

Figure 13:
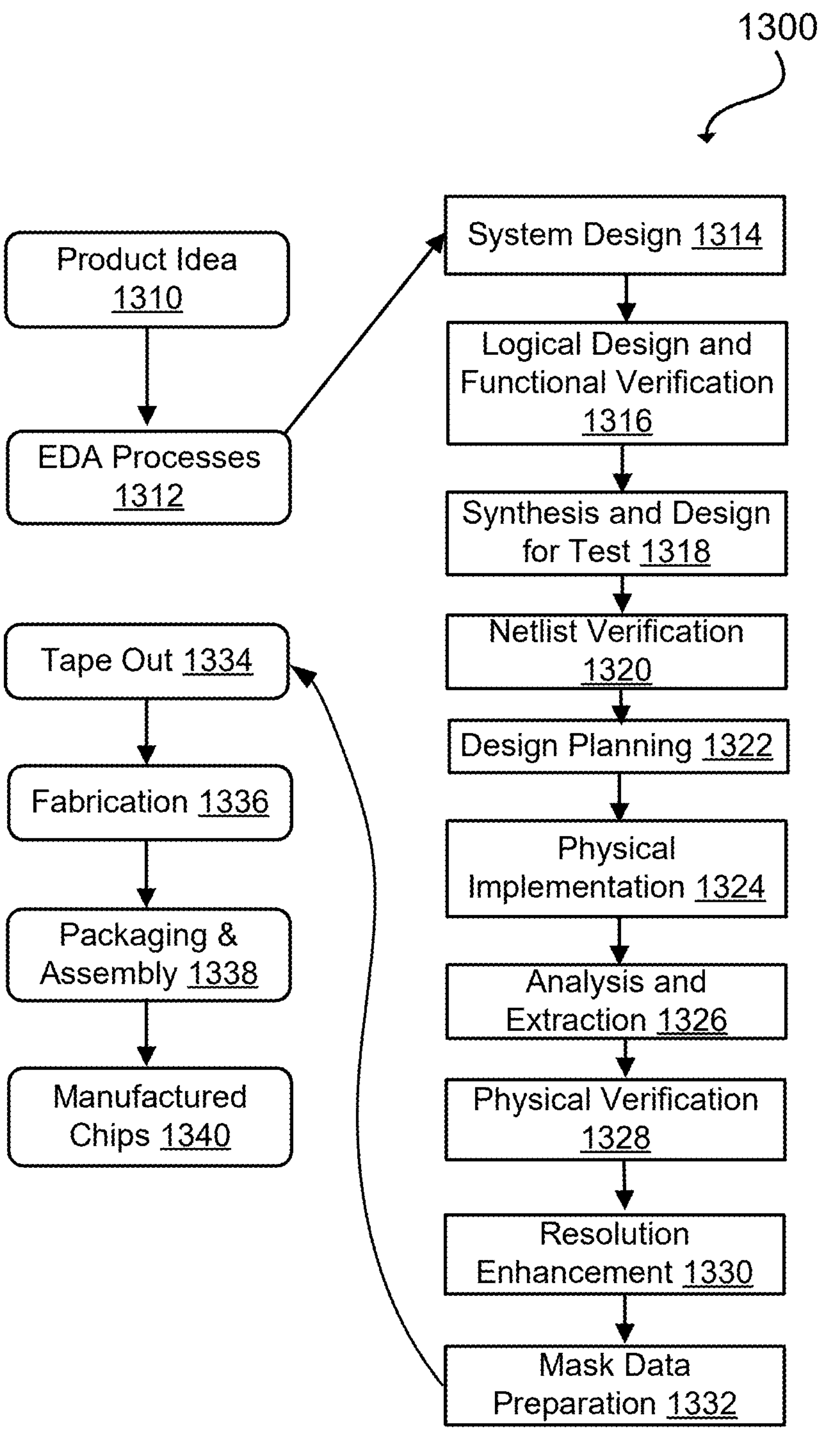
FIG. 13 depicts a flowchart of various processes used during the design and manufacture of an integrated circuit in accordance with some embodiments of the present disclosure.

FIG. 13 illustrates an example set of processes 1300 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1310 with information supplied by a designer, information which is transformed to create an article of manufacture that uses a set of EDA processes 1312. When the design is finalized, the design is taped-out 1334, which is when artwork (e.g., geometric patterns) for the integrated circuit is sent to a fabrication facility to manufacture the mask set, which is then used to manufacture the integrated circuit. After tape-out, a semiconductor die is fabricated 1336 and packaging and assembly processes 1338 are performed to produce the finished integrated circuit 1340.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 13. The processes described by be enabled by EDA products (or EDA systems).

During system design 1314, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1316, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1318, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1320, the netlist is checked for compliance with timing constraints and for correspondence with the HDL code. During design planning 1322, an overall floor plan for the integrated circuit is constructed and analyzed for timing and top-level routing.

During layout or physical implementation 1324, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1326, the circuit function is verified at the layout level, which permits refinement of the layout design. During physical verification 1328, the layout design is checked to ensure that manufacturing constraints are correct, such as DRC constraints, electrical constraints, lithographic constraints, and that circuitry function matches the HDL design specification. During resolution enhancement 1330, the geometry of the layout is transformed to improve how the circuit design is manufactured.

During tape-out, data is created to be used (after lithographic enhancements are applied if appropriate) for production of lithography masks. During mask data preparation 1332, the 'tape-out' data is used to produce lithography masks that are used to produce finished integrated circuits.

A storage subsystem of a computer system (such as computer system 1400 of FIG. 14) may be used to store the programs and data structures that are used by some or all of the EDA products described herein, and products used for development of cells for the library and for physical and logical design that use the library.

Figure 14:
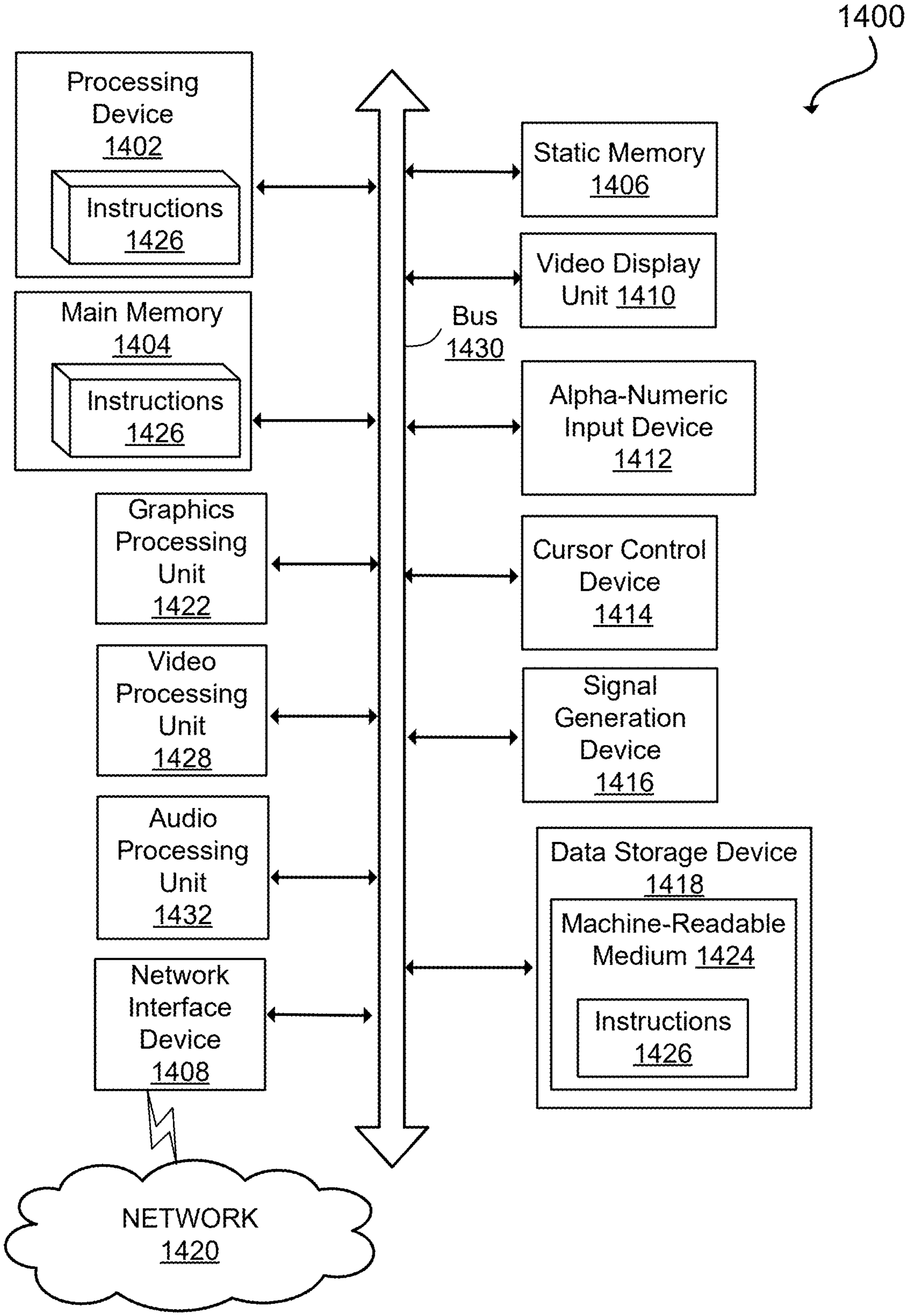
FIG. 14 depicts a diagram of an example computer system in which embodiments of the present disclosure may operate.

FIG. 14 illustrates an example machine of a computer system 1400 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1400 includes a processing device 1402, a main memory 1404 (e.g., read-only memory (ROM), flash memory, dynamic random access memory (DRAM) such as synchronous DRAM (SDRAM), a static memory 1406 (e.g., flash memory, static random access memory (SRAM), etc.), and a data storage device 1418, which communicate with each other via a bus 1430.

Processing device 1402 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. The processing device 1402 may be configured to execute instructions 1426 for performing the operations and steps described herein.

The computer system 1400 may further include a network interface device 1408 to communicate over the network 1420. The computer system 1400 also may include a video display unit 1410 (e.g., a liquid crystal display (LCD) or a cathode ray tube (CRT)), an alphanumeric input device 1412 (e.g., a keyboard), a cursor control device 1414 (e.g., a mouse), a graphics processing unit 1422, a signal generation device 1416 (e.g., a speaker), graphics processing unit 1422, video processing unit 1428, and audio processing unit 1432.

The data storage device 1418 may include a machine-readable storage medium 1424 (also known as a non-transitory computer-readable medium) on which is stored one or more sets of instructions 1426 or software embodying any one or more of the methodologies or functions described herein. The instructions 1426 may also reside, completely or at least partially, within the main memory 1404 and/or within the processing device 1402 during execution thereof by the computer system 1400, the main memory 1404 and the processing device 1402 also constituting machine-readable storage media.

In some implementations, the instructions 1426 include instructions to implement functionality corresponding to the present disclosure. While the machine-readable storage medium 1424 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1402 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

accessing a mask layer comprising a vector representation of a lithographic mask, the lithographic mask comprising a plurality of features that include a curved main feature;

computing a correction field between a simulation field and a target field, wherein the simulation field comprises a field representation of a simulated result of a lithography process using the lithographic mask, and the target field comprises a field representation of a target result of the lithography process;

modifying the main feature of a mask field based on the correction field, wherein the mask field comprises a field representation of the main feature of the lithographic mask; and modifying, by a processing device, the main feature of the mask layer based on the modification to the mask field.

2. The method of claim 1, wherein the mask layer comprises a parameterized curve representing the curved main feature.

3. The method of claim 1, wherein the curved main feature is curvilinear.

4. The method of claim 1, wherein the field representations comprise levelset representations.

5. The method of claim 1, wherein the result of the lithography process is one of: an aerial image, a latent image in resist, a resist structure, and a device structure.

6. The method of claim 1, wherein computing the correction field comprises:

computing an initial correction field by scaling a difference between the simulation field and the target field;

computing an inertia field by scaling a version of the correction field computed in a previous iteration of a plurality of iterations of the method; and determining the correction field by adding the inertia field to the initial correction field.

7. The method of claim 1, further comprising:

generating an inner pseudo contour by sizing down a target layer by an inner band, wherein the target layer comprises a vector representation of the target result;

generating an outer pseudo contour by sizing up the target layer by an outer band; and computing a simulation layer by performing Boolean operations on the mask layer, the inner pseudo contour, and the outer pseudo contour, wherein the simulation layer comprises a vector representation of the simulated result.

8. The method of claim 1, further comprising: converting the mask layer to the mask field by computing a levelset of the main feature of the mask layer.

9. The method of claim 1, further comprising: converting the modified main feature of the mask field to the main feature of the mask layer by applying a contour generation function with a defined threshold to the modified main feature of the mask field.

10. The method of claim 1, further comprising:

receiving a target layer comprising a vector representation of the target result; and determining the target field from the target layer.

11. The method of claim 10, wherein the target layer includes a curved main feature.

12. The method of claim 1, wherein the plurality of features of the lithographic mask include assist features, and the method does not modify the assist features.

13. The method of claim 12, wherein the mask field, the simulation field and the target field include field representations of the main feature but not of the assist features.

14. The method of claim 1, wherein simulation of the lithography process produces a field representation rather than a vector representation.

15. The method of claim 1, wherein modifying the mask layer is incorporated as part of an Inverse Lithography Technology (ILT) process.

16. The method of claim 1, wherein the method is repeated for a plurality of iterations, the method further comprising: outputting a final version of the mask layer from the plurality of iterations.

17. A system comprising:

a memory storing instructions;

a processing device, coupled with the memory and to execute the instructions, the instructions when executed cause the processing device to:

access a mask layer comprising a vector representation of a lithographic mask, the lithographic mask comprising a plurality of features that include a curved main feature, run a simulation of a lithography process using the lithographic mask to generate a simulated result of the lithography process, compute a correction field between a simulation field and a target field, wherein the simulation field comprises a field representation of the simulated result, and the target field comprises a field representation of a target result of the lithography process, modify the main feature of a mask field based on the correction field, wherein the mask field comprises a field representation of the main feature of the lithographic mask, and modify the main feature of the mask layer based on the modification to the mask field.

18. The system of claim 17, wherein the instructions when executed further cause the processing device to:

receive a target layer comprising a vector representation of the target result; and determine the target field from the target layer, wherein the target layer includes a curved main feature, and wherein, the plurality of features of the lithographic mask include assist features that are not modified, the mask field, the simulation field and the target field include field representations of the main feature but not of the assist features, simulation of the lithography process produces a field representation rather than a vector representation, and modifying the mask layer is incorporated as part of an Inverse Lithography Technology (ILT) process.

19. A non-transitory computer readable medium comprising stored instructions, which when executed by a processing device, cause the processing device to:

access a mask layer comprising a vector representation of a lithographic mask, the lithographic mask comprising a curved main feature;

compute a correction field between a simulation field and a target field, wherein the simulation field comprises a field representation of a simulated result of a lithography process using the lithographic mask, and the target field comprises a field representation of a target result of the lithography process;

modify a mask field based on the correction field, wherein the mask field comprises a field representation of the lithographic mask; and modify the mask layer based on the modification to the mask field.

20. The non-transitory computer readable medium of claim 19, wherein the instructions further cause the processing device to:

compute an initial correction field by scaling a difference between the simulation field and the target field;

compute an inertia field by scaling a version of the correction field that was previously computed; and determine the correction field by adding the inertia field to the initial correction field.

* * * * *